United States Patent [19]

Heisey

[11] 4,401,352
[45] Aug. 30, 1983

[54] CONNECTOR SYSTEM FOR CONNECTING A CERAMIC SUBSTRATE TO A PRINTED CIRCUIT BOARD

[75] Inventor: Jay M. Heisey, Elizabethtown, Pa.

[73] Assignee: AMP Incorporated, Harrisburg, Pa.

[21] Appl. No.: 312,200

[22] Filed: Oct. 19, 1981

[51] Int. Cl.³ .............................................. H05K 1/14
[52] U.S. Cl. ............................................... 339/17 CF
[58] Field of Search .......... 339/17 LC, 17 LM, 17 M, 339/17 R, 17 C, 275 R, 275 B, 218 R, 218 M; 361/412, 413

[56] References Cited

U.S. PATENT DOCUMENTS

| | | | |
|---|---|---|---|
| 3,066,367 | 12/1962 | Garman | 24/81 |
| 3,652,899 | 3/1972 | Henschen | 317/101 |
| 3,764,955 | 10/1973 | Ward | 339/65 |
| 3,941,442 | 3/1976 | Friend | 339/17 M |
| 3,951,495 | 4/1976 | Donaher et al. | 339/17 CF |
| 3,954,175 | 5/1976 | Mason | 339/17 LM |
| 4,204,722 | 5/1980 | Yasui et al. | 339/17 CF |

Primary Examiner—Joseph H. McGlynn
Assistant Examiner—David Pirlot
Attorney, Agent, or Firm—Allan B. Osborne

[57] ABSTRACT

The present invention relates to a system for mechanically holding a ceramic substrate and which can be removably plugged into a printed circuit board whereupon the substrate circuits are electrically connected to the circuits on the board. More particularly, the system includes two parallel lengths of a plurality of conductive elements held in an elastomeric matrix with the elements and matrix cooperating to receive and hold the substrate.

7 Claims, 4 Drawing Figures

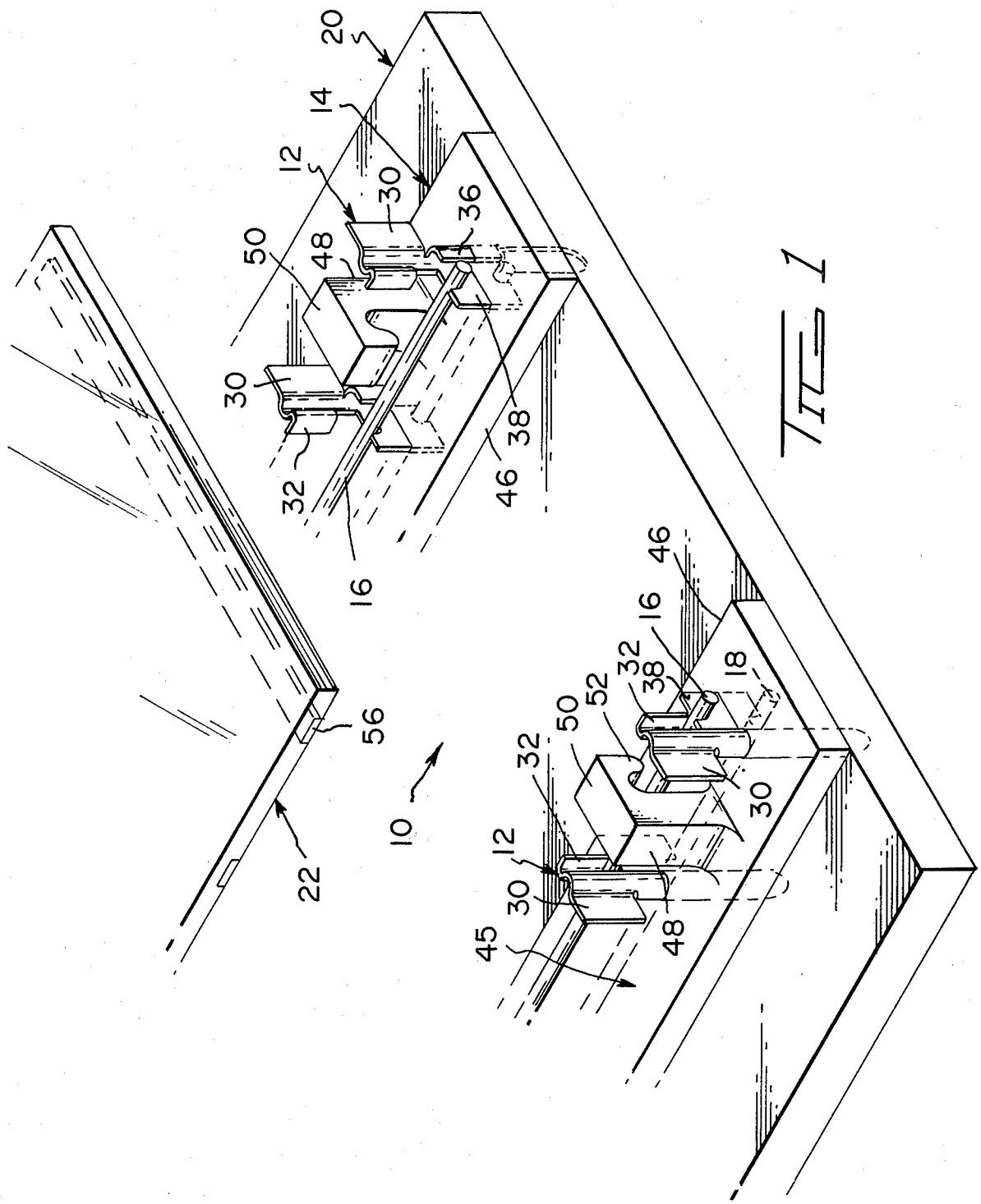

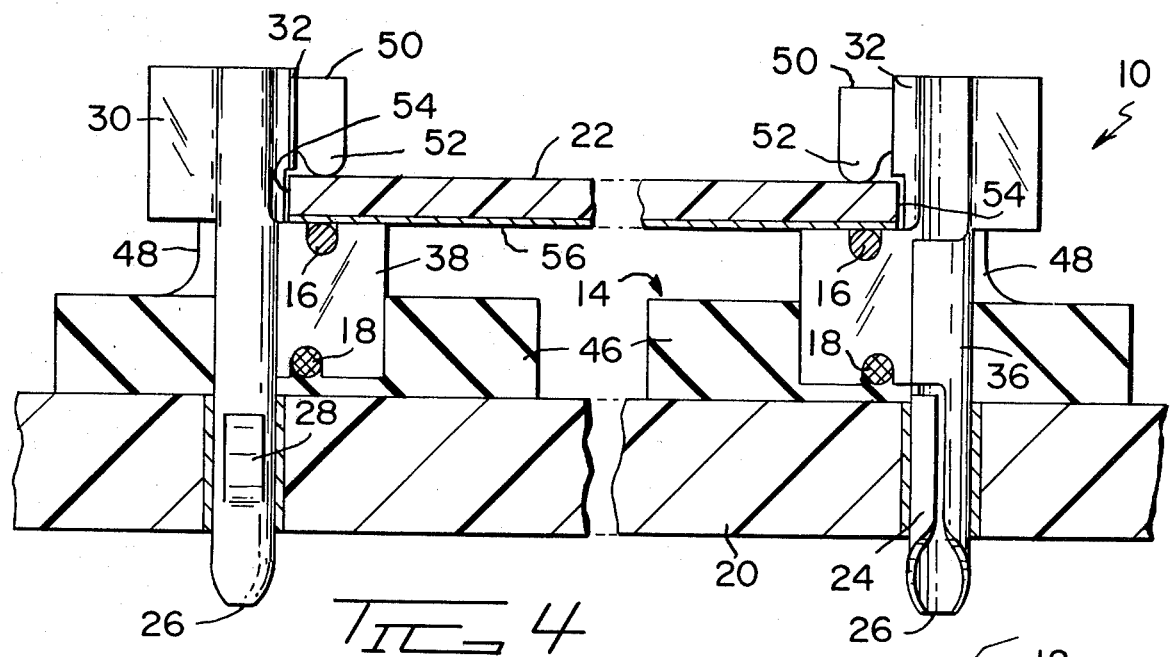
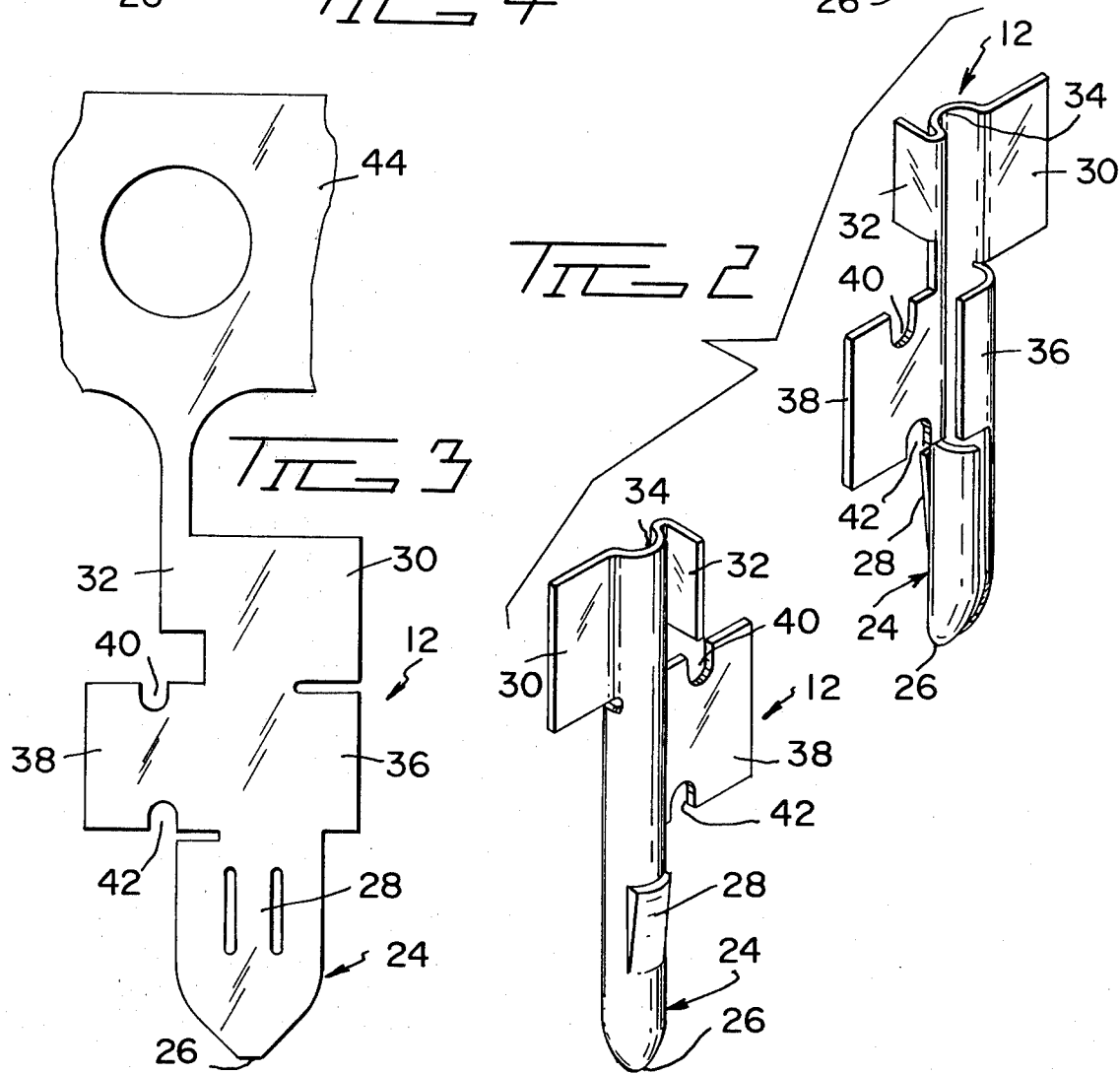

CONNECTOR SYSTEM FOR CONNECTING A CERAMIC SUBSTRATE TO A PRINTED CIRCUIT BOARD

U.S. Pat. No. 3,764,955 discloses a connecting and mounting device specifically designed for holding a substrate and electrically connecting the conductive pads thereon to conductive traces on a printed circuit board in which the device is plugged. Two spaced apart, parallel beams of substantial width on the device provide a receptacle for the edge of the substrate. A post, integral with the beams and extending normal thereto, is adapted for insertion into a plated-through hole in the circuit board and soldered therein.

The present invention is to a connector system for connecting delicate ceramic substrates to a circuit board. It is characterized by two spaced apart rows each consisting of a plurality of conductive elements having a pin at the lower end for insertion into a printed circuit board for electrical contact with circuits thereon, and a laterally extending plate positioned above the pin, each row of elements being positioned in an elongated, elastomeric matrix having a base below which the pins extend and posts extending upwardly from the base between the conductive elements with flanges depending from fingers projecting laterally from the posts in the same direction as the plates so that the flanges and upwardly facing edges of the plates cooperate to form a slot, said matrices being arranged in the two parallel rows with the slots in one row facing the slots in the other row so that opposing edges of the substrate may be inserted into the two rows of slots with the circuits on the substrate being in electrical contact with the elements.

For a better understanding of the invention, reference will now be made by way of example to the accompanying drawings, in which:

FIG. 1 is a perspective view illustrating the connector system of the present invention as mounted on a printed circuit board but with the ceramic substrate exploded out therefrom;

FIG. 2 is a perspective view of an opposing pair of stamped and formed connecting devices of FIG. 1;

FIG. 3 is a stamped, pre-formed connecting device of the present invention; and

FIG. 4 is a cross-sectional view of the connector system of FIG. 1 with the ceramic substrate fixed thereto.

The connector system of the present invention consists of principally two distinctly different components which are joined together cooperatively to mechanically hold a delicate ceramic substrate and to be removably plugged into a printed circuit board to thereby electrically connect the circuits on the substrate to the circuit on the board.

This system, generally indicated by reference numeral 10 in FIG. 4, includes two lengths of conductive elements 12 in an elastomeric matrix 14. Other components include solder rod 16 and anti-stretch cord 18.

FIG. 1 also shows a printed circuit board 20 into which system 10 is removably plugged and ceramic substrate 22 which is fixed into system 10. Other type substrates can be used with the system, however.

Conductive elements 12 are shown perspectively in FIG. 2. Preferably, these elements are stamped and formed from a coplanar strip of conductive material such as pre-tinned phosphor bronze. They are formed into a generally cylindrical shape to provide a high degree of rigidity. Each element has a pin 24 at its lower end. The tip 26 of the pin may be pointed as shown to facilitate its insertion into a hole in board 20. The pin is otherwise cylindrical and hollow. Lance 28 is struck from the body of pin 24 and extends obliquely outwardly in an upward direction to provide spring means for retaining element 12 in the board.

The upper end of each element carries ears 30 and 32, the former being the largest and projecting straight out from the element. The latter is smaller and is bent around to be on a tangent to the element. Strap 34 connects the two ears.

The section of element 12 between the ears and pin 24; i.e., midsection 36, includes plate 38 which projects outwardly in the same vertical plane as large ear 30 but in a diametrical direction. Arcuate grooves 40 and 42 are provided in the upper and lower sides of the plate. As noted above, elements 12 are preferably stamped and formed. FIG. 3 shows a stamped or blanked element before being formed. Each of the pre-formed structural features are referenced with the same reference numerals as used in the other Figures for ease in correlation. The rolling and forming of the element is readily apparent from the drawing to those skilled in that art.

The conductive element 12 is shown in FIG. 3 still attached to its carrier strip 44.

After the elements 12 are stamped and formed, carrier strip 44 is removed and the elements are placed in a mold (not shown) in which anti-stretch cord 18 has already been positioned. Pins 24 on the elements are placed into tight fitting holes in the mold and grooves 42 worked onto cord 18. The number of elements which the mold can receive would preferably not be less than the number required to receive an edge of substrate 22.

After closing the mold, the elastomeric material, preferably silicon rubber, is injected to form elastomeric matrix 14. It, along with embedded cord 18 and the several partially embedded elements 12 are removed from the mold in one continuous length, indicated by reference numeral 45 in FIG. 1. The structure is held together by the strength of the matrix itself with aid from anti-stretch cord 18.

With reference to FIGS. 1 and 4, it can be seen that matrix 14 includes a base 46 in which the lower half of midsection 36, including the lower half of plate 38 of elements 12 are embedded. The matrix further includes the elastomeric material that flowed into and filled up the interior of pins 24 to complement the spring force of lance 28. None of the material, however, contacts the outside surface of the pins due to the precisely dimensioned pin-receiving holes in the mold.

The matrix also includes a plurality of retaining posts 48 which extend upwardly from base 46. These posts are spaced between and may, but are not necessarily as tall as, elements 12. A finger 50 extends laterally from the top, free end of the post and a flange 52 depends from the free end of the finger. The flange parallels solder rod 16 when positioned in grooves 40. Precisely locating the flange is not critical, provided, however, it contacts board 22 near the edge thereof. The vertical distance between the flanges and top edges of plates 38 is slightly less than the thickness of substrate 22.

Solder rod 16 is laid into grooves 40 after lengths 45 are made.

A system 10 consists of two parallel lengths 45 of the proper number of elements 12 arranged so that plates 38 on elements 12 and flanges 52 on posts 48 face each other such as shown in FIG. 4 to which reference is now made. The lengths are precisely held in a jig (not shown) and opposing edges 54 of substrates 22 placed in between flanges 52 and plates 38 with traces 56 on the substrate being pressed against the top edge of the plates. Thereafter, solder rod 16 is fused to solder bond the substrate to elements 12.

The assembly described above may now be plugged into board 20 as a unit and removed if desired. The resilient posts 48, fingers 50, and flanges 52, permit some flexing of the elements 12/substrate 22 to provide protection against substrate breakage.

Ears 30 provide a latching location for a pincher-type tool (not shown) for inserting and removing the assembly from board 20.

Ears 32 and their positioning provides a means for orientating the elements on the carrier strip for handling on reels and in gang insertion into the mold.

I claim:

1. A system for holding a ceramic substrate, or the like, and for electrically connecting the circuits thereon of circuits on a printed circuit board, the system comprising:
   a. a plurality of conductive elements, each having a pin at the lower end for insertion into a printed circuit board for electrical contact with circuits thereon and a laterally extending plate, positioned above the pin, having an upwardly facing edge, said elements being arranged in two parallel, spaced apart rows with the plates facing inwardly the other row;
   b. a pair of elongated elastomeric matrices, each having a base through which the conductive elements extend with the pins depending therefrom and a plurality of posts projecting upwardly from the base and positioned between the conductive elements, said posts having a flange depending from a finger projecting laterally towards the other row, said flanges
cooperating with the upwardly facing edges on the plates to form slots in which the opposing edges of the substrate are received with the circuits on the substrate being in electrical contact with the plates.

2. The system of claim 1 further including means on the conductive elements for solder bonding the circuits on the substrate to the conductive elements.

3. The system of claim 1 further including a cord extending through the base of each matrix for preventing the matrix from stretching so that the conductive elements extending through the base remain precisely located with respect to each other.

4. The system of claim 3 wherein grooves are provided in downwardly facing edges of the plates and in which the cord is received.

5. The system of claim 1 wherein the pins are hollow and are filled with elastomeric material constituting an integral part of the matrices.

6. The system of claim 2 in which the means includes a groove in the upwardly facing edge on the plates with a solder rod being positioned in the grooves of each row for subsequent reflowing.

7. The system of claim 1 further including means on the upper end of each conductive element for being gripped so that the system can be removed from the printed circuit board.

* * * * *